(12) United States Patent
Smith et al.

(10) Patent No.: US 7,808,643 B2
(45) Date of Patent: Oct. 5, 2010

(54) DETERMINING OVERLAY ERROR USING AN IN-CHIP OVERLAY TARGET

(75) Inventors: Nigel P. Smith, Hsinchu (TW); Kevin E Heidrich, Beaverton, OR (US)

(73) Assignee: Nanometrics Incorporated, Milpitas, CA (US)

( * ) Notice: Subject to any disclaimer, the term of this patent is extended or adjusted under 35 U.S.C. 154(b) by 112 days.

(21) Appl. No.: 12/340,563

(22) Filed: Dec. 19, 2008

(65) Prior Publication Data

US 2009/0116014 A1   May 7, 2009

Related U.S. Application Data

(63) Continuation-in-part of application No. 11/360,031, filed on Feb. 22, 2006, now Pat. No. 7,477,396.

(60) Provisional application No. 60/656,662, filed on Feb. 25, 2005.

(51) Int. Cl.
G01N 21/55 (2006.01)
(52) U.S. Cl. .................................................. 356/445
(58) Field of Classification Search .................. 356/445
See application file for complete search history.

(56) References Cited

U.S. PATENT DOCUMENTS

| | | | |
|---|---|---|---|
| 4,149,085 A | 4/1979 | Davis et al. | |
| 5,504,999 A | 4/1996 | Barr | |
| 5,958,632 A | 9/1999 | Sekiguchi | |
| 6,022,650 A | 2/2000 | Sogawa | |
| 6,077,756 A | 6/2000 | Lin et al. | |
| 6,083,807 A | 7/2000 | Hsu | |
| 6,462,818 B1 | 10/2002 | Bareket | |
| 6,486,954 B1 | 11/2002 | Mieher et al. | |
| 6,536,130 B1 | 3/2003 | Wu et al. | |
| 6,571,485 B1 | 6/2003 | Yu et al. | |
| 6,636,311 B1 | 10/2003 | Ina et al. | |
| 6,734,971 B2 | 5/2004 | Smith et al. | |

(Continued)

FOREIGN PATENT DOCUMENTS

JP   06-216206 A   8/1994

(Continued)

OTHER PUBLICATIONS

Accent—Caliper Élan Tool Brochure located at http://accentopto.com/Accent/productDetailasp?product_id1&detail_id=3, (last visited on Aug. 11, 2004); (1 pg).

(Continued)

*Primary Examiner*—Roy Punnoose
(74) *Attorney, Agent, or Firm*—Silicon Valley Patent Group LLP

(57) ABSTRACT

Overlay error between two layers on a substrate is measured using an image of an overlay target in an active area of a substrate. The overlay target may be active features, e.g., structures that cause the device to function as desired when manufacturing is complete. The active features may be permanent structures or non-permanent structures, such as photoresist, that are used define the permanent structures during manufacturing. The image of the overlay target is analyzed by measuring the light intensity along one or more scan lines and calculating a symmetry values for the scan lines. Using the symmetry values, the overlay error can be determined.

39 Claims, 10 Drawing Sheets

U.S. PATENT DOCUMENTS

| | | |
|---|---|---|
| 6,788,393 B2 | 9/2004 | Inoue |
| 6,916,585 B2 | 7/2005 | Sreenivasan et al. |
| 7,084,427 B2 | 8/2006 | Argandona et al. |
| 7,160,657 B2 | 1/2007 | Smith et al. |
| 7,346,878 B1 | 3/2008 | Cohen et al. |
| 7,379,184 B2 | 5/2008 | Smith et al. |
| 2002/0063856 A1 | 5/2002 | Inoue |
| 2003/0027065 A1 | 2/2003 | Fujimoto |
| 2003/0077527 A1 | 4/2003 | Ausschnitt et al. |
| 2003/0095267 A1 | 5/2003 | Mieher et al. |
| 2003/0156750 A1 | 8/2003 | Dajee et al. |
| 2004/0004726 A1 | 1/2004 | Sezginer et al. |
| 2004/0032581 A1 | 2/2004 | Nikoonahad et al. |
| 2004/0038455 A1* | 2/2004 | Seligson et al. ............ 438/122 |
| 2004/0063009 A1 | 4/2004 | Phan et al. |
| 2004/0066963 A1 | 4/2004 | Hechtl et al. |
| 2004/0126004 A1 | 7/2004 | Kikuchi |
| 2005/0195398 A1 | 9/2005 | Adel et al. |
| 2005/0208683 A1 | 9/2005 | Chen |
| 2005/0264783 A1 | 12/2005 | Smith et al. |
| 2006/0115751 A1 | 6/2006 | Fay et al. |
| 2006/0151890 A1 | 7/2006 | Smith et al. |

FOREIGN PATENT DOCUMENTS

| | | |
|---|---|---|
| WO | WO 01/29618 | 4/2001 |
| WO | WO 01/98835 | 12/2001 |
| WO | WO 01/99150 | 12/2001 |
| WO | WO 2004/049072 | 6/2004 |
| WO | WO-2006/044320 | 4/2006 |
| WO | WO-2006/093722 | 9/2006 |

OTHER PUBLICATIONS

Caliper Tool Brochure (Aug. 11, 2004); (1 pg).
Combined International Preliminary Report on Patentability mailed on Oct. 16, 2007 & Written Opinion mailed on Sep. 24, 2007 for PCT Application No. PCT/US06/06092 filed on Feb. 22, 2006 by Accent Optical Technologies, Inc., (4 pgs).
International Search Report mailed on Sep. 24, 2007 for PCT Application No. PCT/US06/06092 filed on Feb. 22, 2006 by Accent Optical Technologies, Inc., (2 pgs).
Combined International Search Report and Written Opinion mailed on Jan. 24, 2007 for PCT Application No. PCT/US2005/36371, filed on Oct. 11, 2005 by Accent Optical Technologies, Inc. (10 pgs).
Attota, R. et al., "Evaluation of New In-chip and Arrayed Line Overlay Target Designs", Proc of SPIE vol. 5375; pp. 395-402; Bellingham, WA (2004) (8 pgs).
Tung, et al., "Improved Thin Film Model for Overlay Metrology", Proc. of SPIE vol. 5752; pp. 183-191 Bellingham, WA (2005) (9 pgs).
Ku et al., "In-chip overlay measurement by existing bright-field imaging optical tools", Proc of SPIE vol. 5527; pp. 438-448, Bellingham, WA (2005) (11 pgs).
Ku et al., "In-chip overlay metrology", Proc of SPIE vol. 6152:214-1-214-12, (2006) (12 pgs).

* cited by examiner

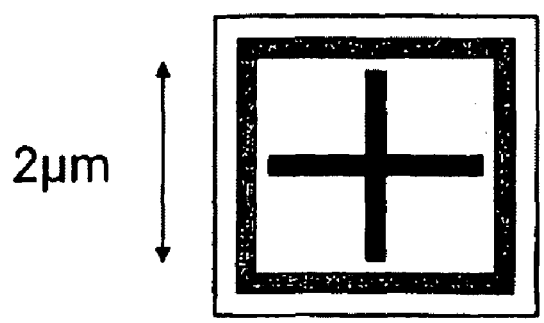
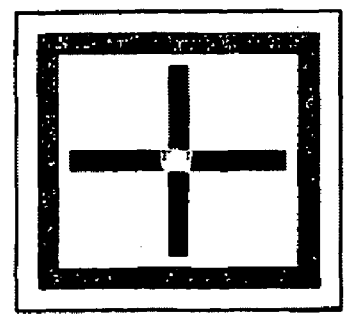
FIG. 1A    FIG. 1B
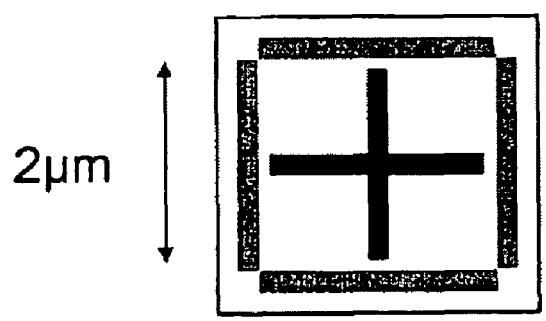
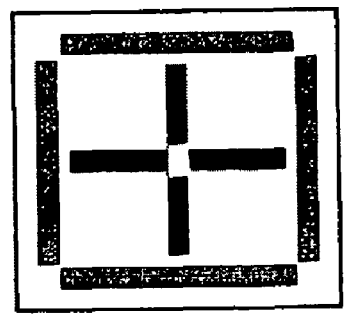
FIG. 1C    FIG. 1D
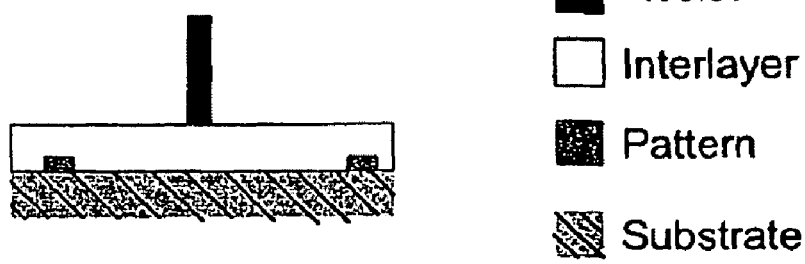
FIG. 2

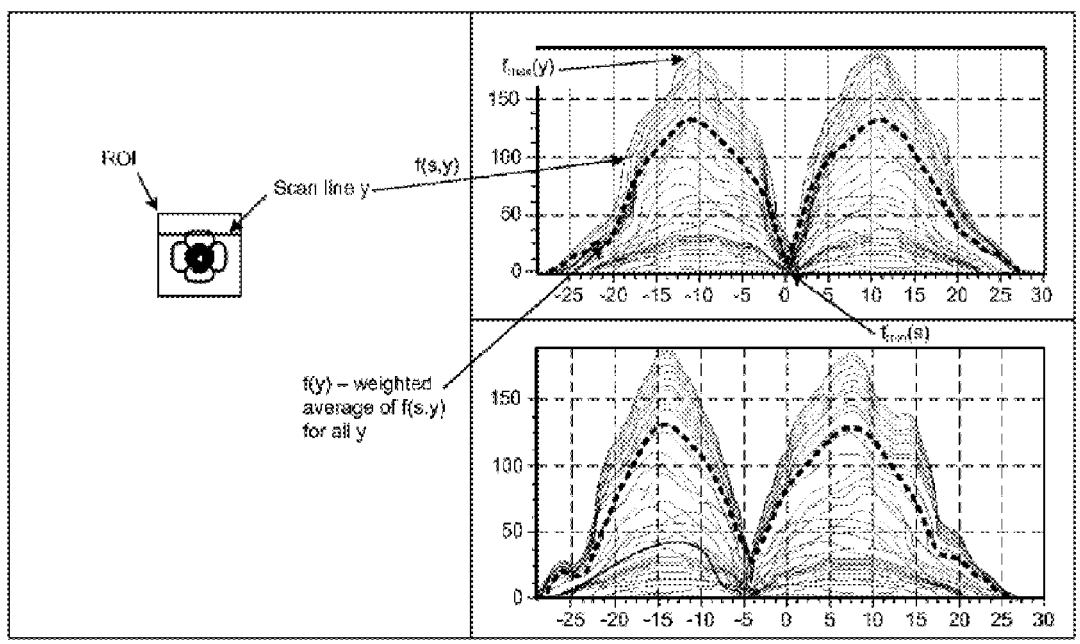

DETERMINING OVERLAY ERROR USING AN IN-CHIP OVERLAY TARGET

CROSS REFERENCE TO RELATED APPLICATIONS

This application is a continuation-in-part of U.S. application Ser. No. 11/360,031, filed Feb. 22, 2006, which claimed priority to U.S. Provisional Patent Application No. 60/656,662 filed Feb. 25, 2005, both of which are incorporated herein by reference.

BACKGROUND OF THE INVENTION

The field of the invention is overlay measurements in manufacturing of semiconductor and similar devices formed from layers.

Modern semiconductor devices, such as integrated circuits, are typically fabricated from wafers of semiconductor material. The wafers are fabricated by a succession of patterned layers of semiconductor material. Circuit patterns are fabricated using a variety of long established techniques, for example, lithographic techniques.

Overlay metrology in semiconductor device fabrication is used to determine how well one printed layer is overlaid and aligned with a previously printed layer. Close alignment of each layer at all points within the device is important for reaching the design goals. It is consequently important for the efficiency of the manufacturing process that any alignment error between two patterned layers on a wafer can be measured quickly and accurately. It is similarly important to be able to measure any alignment error between successive exposures to the same layer. Misregistration between layers is referred to as overlay error. Overlay metrology tools or machines are used to measure the overlay error. This information may be fed into a closed loop system to correct the overlay error.

Current overlay metrology uses optically readable target marks or patterns printed onto layers of a substrate, typically a semiconductor wafer, during fabrication. The relative displacement of two successive layers is measured by imaging the patterns at high magnification, digitizing the images, and processing the image data using various known image analysis algorithms to quantify the overlay error. Overlay metrology techniques thus involve the direct measurement of misregistration between patterns provided in direct association with each of the layers. As semiconductor devices become progressively smaller, making accurate overlay measurements becomes increasingly difficult. It is also important that new measurement methods and systems be able to perform at the relatively high speeds achieved with existing overlay metrology technology. Use of repeated measurements is undesirable, unless they can be made without requiring significantly more time. Consequently, developing improved metrology methods and systems raises significant technical challenges.

One technique for working with increasingly smaller microelectronic devices is use of simple targets which can be reduced in size and placed within the active area of the device. U.S. patent application Ser. No. 11/035,652, incorporated herein by reference, describes these kinds of targets.

Targets which are small enough to be placed within the active area of devices allow measurements to be made where they are actually needed. Adoption of these targets requires that they be as small as practical and, ideally, that they can be measured with existing overlay tools. There is no single correct size for these targets. However, the smaller they are, the more likely they are to be used. Targets occupying an area of approximately 1 μm square are advantageously achieved. The "size" of the target must include any blank area around it required for proper measurement.

Current optical overlay measurement systems use visible light and operate with optical resolution of approximately 0.5-1.0 μm. These systems will generally not be able to resolve the features within the proposed targets. Although these types of systems may be changed to improve optical resolution, system changes tend to be relatively time consuming, costly and with potentially uncertain results. Consequently, changing the use and operation of existing systems to provide for accurate measurements of smaller targets would be highly advantageous.

SUMMARY

With use of new breakthrough methods of operation and programming, existing systems can be made to measure accurately extremely small targets. It has surprisingly been discovered that there is a relationship between asymmetry and overlay error, and that overlay error can actually be determined or calculated based on asymmetry (or symmetry). As a result, the advantages of using very small in-chip targets can be achieved, while their disadvantages are reduced or eliminated. Methods are provided for determining overlay error based on measured asymmetry. The methods can be used with existing measurement tools and systems. The methods, and systems using the methods, allow for improved manufacturing of semiconductor devices and similar devices formed from layers.

The overlay error between two layers on a substrate is measured using an image of an in-chip overlay target, i.e., that is in an active area of a substrate. The overlay target may be active features, e.g., structures that cause the device to function as desired when manufacturing is complete. The active features may be permanent structures or non-permanent structures, such as photoresist, that are used to define the permanent structures during manufacturing. The image of the overlay target is analyzed by measuring the light intensity along one or more scan lines and calculating symmetry values for the measured scan lines. Using the symmetry values, the overlay error can be determined. In one embodiment, the active features that are used as the overlay target are determined by searching an electronic design database for appropriate active features, i.e., active features that meet the desired rules for the overlay target, such as sensitivity, and/or geometry and size considerations. Alternatively, a plurality of active features on a chip may be imaged and the images analyzed to locate an appropriate set of active features to serve as the overlay error.

BRIEF DESCRIPTION OF THE DRAWINGS

FIGS. 1A, 1B, 1C and 1D are plan views of an overlay target on a substrate.

FIG. 2 is section view of the targets shown in FIGS. 1A-D.

FIG. 7 is a plan view of the target of FIG. 5 within the region of interest.

FIG. 8 is a graph of the f (s, y) curves (shown in light gray lines) for the X-axis for each scan line y in FIG. 7. FIG. 8 also shows the weighted average of f (s, y) for all y (as the darker black line). In FIG. 8, fmin(s) is at or near zero, i.e., at the center of the target, indicating little or no offset along the X-axis.

FIG. 9 is a graph similar to FIG. 8 but for the Y-axis and showing the curves with a large overlay error. In FIG. 9, fmin(s) occurs at about the −5 microns position, with a minimum symmetry value of about 25, indicating large overlay error.

In FIGS. 8-10, the X-axis corresponds to position of location in the region of interest, here shown as extending from about −25 nm to +25 nm. The Y-axis corresponds to calculated degree of symmetry (based on comparison of intensity values), with lower values indicating greater symmetry, and higher values indicating less symmetry.

DETAILED DESCRIPTION OF THE DRAWINGS

A test reticle set was designed incorporating potential in-chip overlay measurement targets. Two sets of wafers were made with varying thicknesses of poly-silicon or SiO2 between the buried and surface patterns. This process created structures with the characteristic of films which prove challenging for the current generation of overlay tools: low contrast patterns buried beneath transparent or semi-transparent films of significant thickness. Test results show that it is possible to make accurate overlay measurements using such small targets. However, new image processing methods are needed to make these measurements.

Asymmetry in experimental optical intensity profiles from an in-chip overlay target has been observed. The asymmetry apparently results from proximity effects. Overlay offsets calculated from an asymmetric image, without specifically accounting for the proximity effect, will contain a measurement error in overlay. See R. Attota et al., Evaluation of New In-Chip and Arrayed Line Overlay Target Designs, Proceedings of the SPIE, Vol. 5375, p. 395-402, May 2004. However, as described below, overlay error can actually be determined based on measured asymmetry.

One way of performing the method is:

I. Define a region of interest (ROI) that substantially completely encloses the target or pattern being measured. The ROI should also allow for uncertainty in the location of the target after using pattern recognition. Typically this will make the ROI about 1, 2, 3, 4, or 5 microns wider than the design size of the target. FIG. 1 shows a 2 micron cross-in-frame target. The cross-in-frame design maximizes spacing within the target. Of course, other target shapes and sizes may be used. Targets with an outer dimension of 1 micron may also be used. The ROI around the target is shown in FIG. 7.

Figure 12:
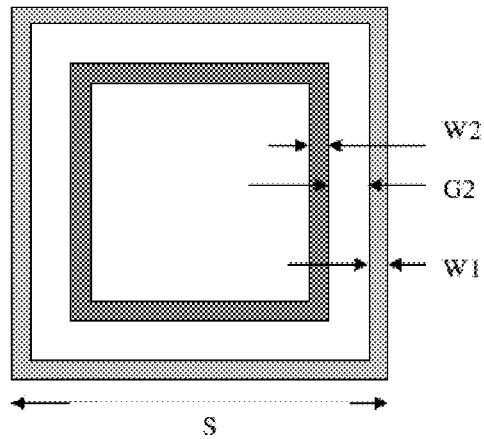
FIGS. 12 and 13 illustrate a frame-in-frame target and a box-in-frame target, respectively.
Figure 13:
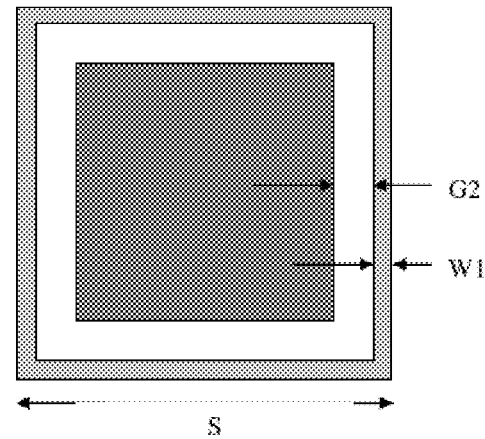

By way of example, overlay targets that have a large degree of spatial uniformity, such as a frame-in-frame target or a box-in-frame target, may be used. FIGS. 12 and 13 illustrate a frame-in-frame target and a box-in-frame target, respectively. To minimize the footprint, the total size (S) of the targets should be minimized, e.g., e.g., 2 μm, but S may vary up to 3 μm or more, or may be less than 2 μm with no lower limit to the ideal size. The spacing (G2) is related to the functioning of the target, where a small spacing (G2) produces a rapid change of image symmetry with overlay error, which is desirable. The optimum values of the size (S), spacing (G2), and line widths (W1) and (W2) (in the frame-in-frame target) will vary with process conditions and film stack, and can be determined using an image model, such as discussed by C. H. Tung et al, "Improved thin-film model for overlay metrology", Proc SPIE 5752 (2005)) which is incorporated herein by reference, or by printing targets using a range of parameters and determining the best size experimentally. Experimental optimization would be based on assessment of rate of change of image asymmetry with overlay increase, assessment of measurement precision, TIS and fidelity of results to overlay measured using a different technique such as traditional bright-field imaging of larger targets, as discussed by Y. S. Ku et al, "In-chip overlay metrology", Proc SPIE 6152 (2006), which is incorporated herein by reference. A value of 250 nm for G2 has been shown to work well for a box-in-frame target with a size S of 3 μm when imaged with a lens having NA of 0.5, and may be used when model or experimental determination is not feasible.

The following description relates to X-axis or first axis measurement. Y-axis or second axis measurement is performed in the same way, exchanging "X" for "Y".

II. The image of the target on the detection device in the measuring system or tool changes in the direction perpendicular to the measurement. This image is divided into a series of scan lines (y), each running along the direction of measurement, as shown in FIG. 7. The number of scan lines will normally be equal to the number of camera lines in the direction perpendicular to the direction of measurement within the ROI. Although the detection device is typically a two-dimensional camera, e.g., a CCD camera, other detection devices may also be used, for example, a single photo detector used with raster scanning laser light.

III. In each scan line, designated by (y), an initial candidate center point designated by (s) is selected. The light intensity of the image across the scan line (y) is measured. The measured light intensity on one side of the center point (s) is compared to the measured light intensity at a corresponding point on the other side of the center point. A calculation is then performed indicating the degree of symmetry f(s,y) in the image within the ROI about this candidate center point (s). This procedure is then repeated for additional candidate center points on the scan line. For example, a next candidate center point may be selected by adding a positive or negative incremental value to the initial candidate center point. The candidate center point resulting in the minimum value for f(s,y) is taken as the actual center point, or the center of symmetry. The minimum value of f(s,y) is the point on the scan line having the highest degree of symmetry, i.e., where the measured light intensity profile along one side of the point (s) is most similar or symmetric to the measured light intensity profile along the other side of the point (s).

Calculating symmetry can be performed in several ways. One way of performing it is from the sum of the square of the difference in intensity at all points the same distance either side of the point, via equation 1 below:

$$f(s, y) = \sqrt{\int_{-ROI}^{+ROI} (I(s+X, y) - I(s-X, y))^2 dX} \qquad \text{Equation 1}$$

where I(x,y) is the image intensity, (s) is the center point, and the symmetry value at a point s is f(s,y).

Figure 10:
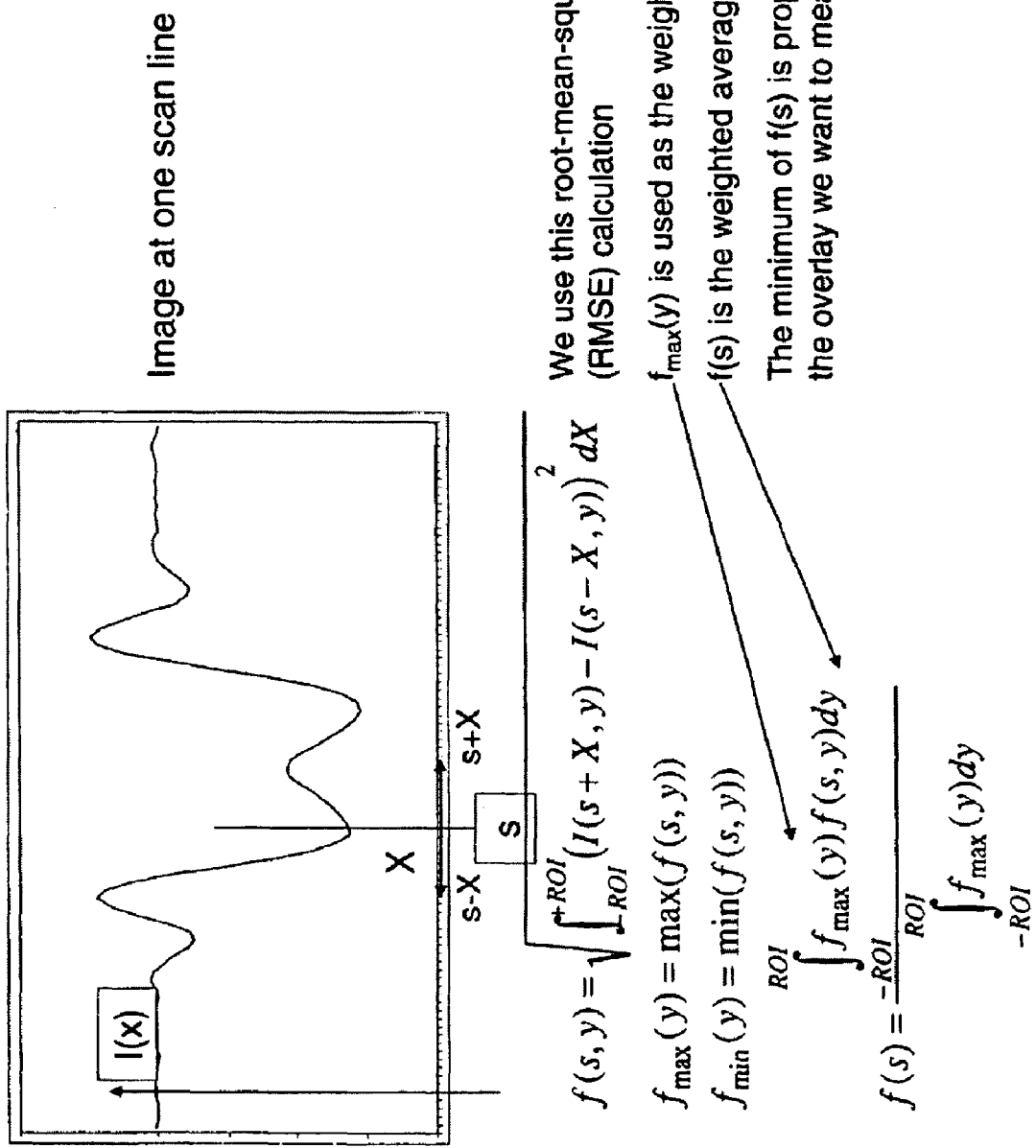
FIG. 10 is a diagram showing selection of a candidate center point and performing a calculation indicating the degree of symmetry in the image within the region of interest about the selected center point.

This equation 1 is shown along with an image at one scan line (y) in FIG. 10.

In FIGS. 8 and 9, the f(s,y) curves for each scan line (y) are shown as the lighter lines. The maximum of these curves (labeled as fmax (y) is related to how much information they contain. The ROI extends beyond the frame of the target, as shown in FIG. 7. Consequently, as shown in FIGS. 8 and 9, the ends of some or all of the scan lines may not go through the target, and do not contribute to any calculation or measurement.

IV. The overlay result is proportional to the minimum value of f (s,yc) for the scan line (yc) along the center of the target, center referring to the direction perpendicular to the measurement direction. Call the minimum f(s,y) value fmin(y), and the value of fmin(yc) is fmin.

Figure 4:
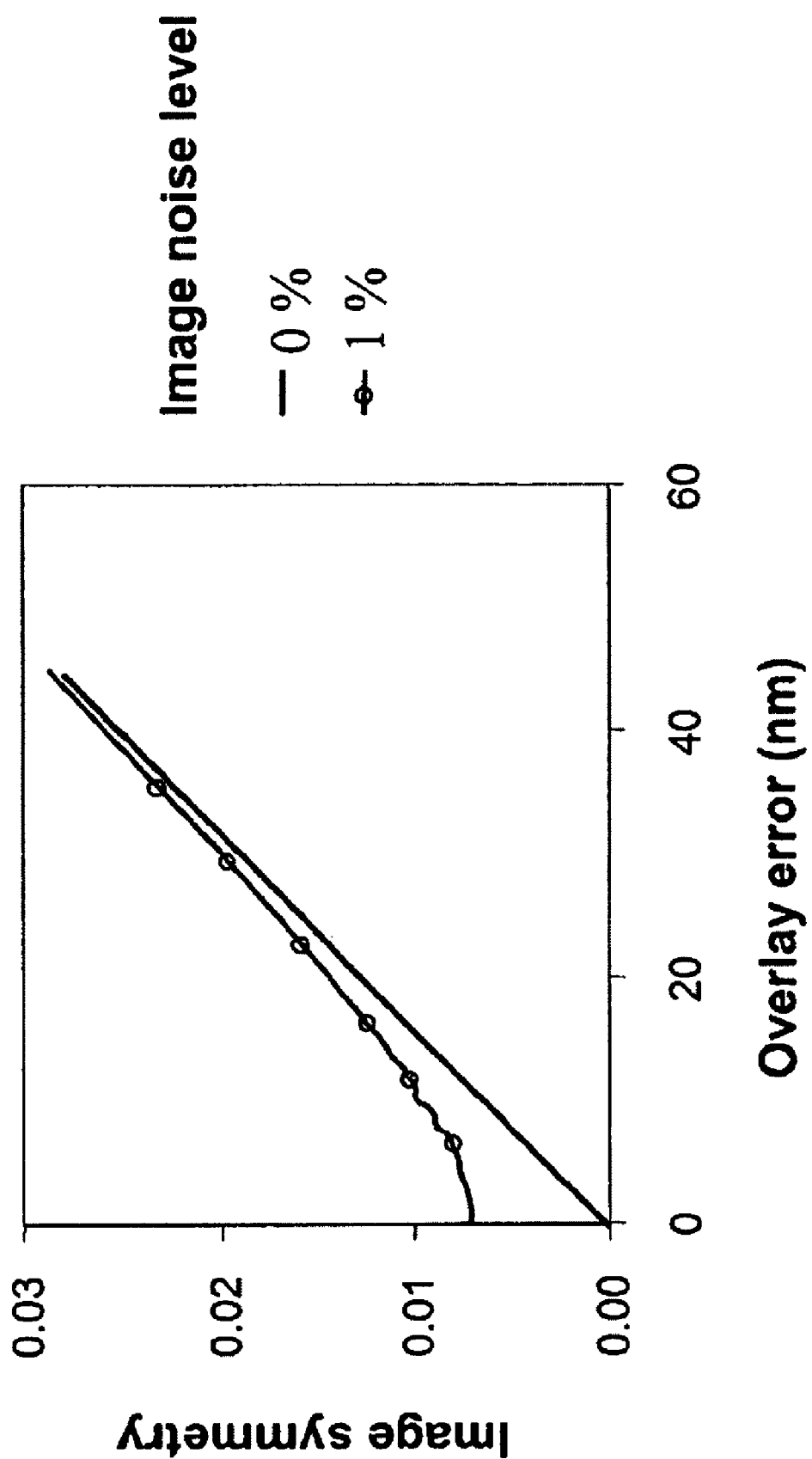
FIG. 4 is a graph of modeled symmetry vs. overlay offset and the effect of image noise.
Figure 11:
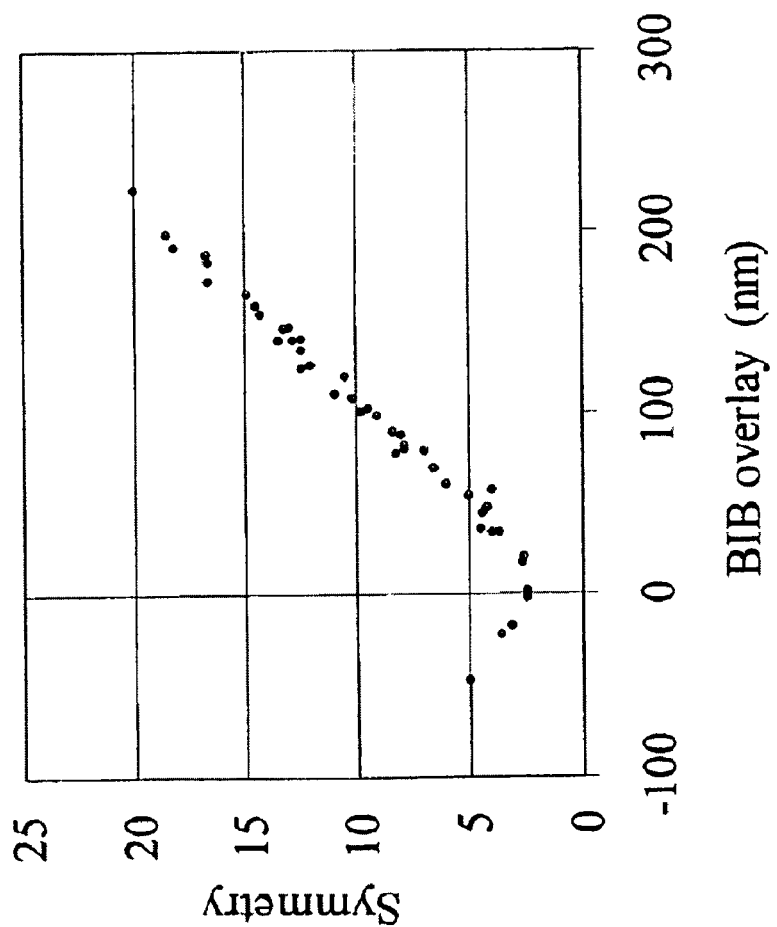
FIG. 11 is a graph of measured symmetry vs. overlay offset.

FIG. 4 is a theoretical graph showing that over useful ranges, overlay offset and modeled symmetry are linear or nearly linear, and have a defined relationship. The experimental data plotted in FIG. 11 of target symmetry and measured overlay shows the predicted relationship between them. In FIG. 11, the X-axis data result from conventional overlay offset measurements using a box-in-box target, while the Y-axis data result from using the target shown in FIG. 1. This data supports the theoretical graph in FIG. 4. In FIG. 4, the lower trace shows modeled symmetry with no noise. As shown, with no noise, the model predicts a straight line correspondence or relation between asymmetry and overlay error. The upper trace shows modeled symmetry with 1% noise (i.e., random variation in the signal equal to about 1% of the maximum signal level).

After a symmetry value for substantially each scan line is determined, they may be combined in one of several different ways, to derive a combined single symmetry value, which is used to calculate target overlay error. The symmetry values for the scan lines may be averaged or combined in other ways. As described below, one way of combining these values is via a weighted average. Another approach, instead of combining the symmetry values, is to select a minimum symmetry value from among all of the symmetry values, for use in determining overlay error.

Yet another approach is to average image data from multiple scan lines over a region where the image changes little or not at all with y, for example if the object being measured is substantially one-dimensional over a distance 10 or more times the spacing between successive scan lines. In this case there is a single averaged scan line, and the symmetry of that scan line can be found using the method outlined above. Other methods of combining scan line data together may also be used.

Whichever method is used, the resulting single symmetry value is then used to determine target overlay error. The resulting single symmetry value may be used to find overlay error using a theoretical model, for example, as shown in FIG. 4. If the target is provided with built in initial overlay error of for example 20-80, 30-70, 40-60 or about 50 nm, the measurements will consistently be located on the linear section of the graph. Thus, more accurate results may be achieved even in the presence of noise.

Another equivalent way to find overlay error is by using an experimental model, for example as shown in FIG. 11.

The additional steps described below are helpful in providing improved precision, although they are not necessarily essential. The method, is a basic form, may be practiced without the following steps.

Measurement precision can be improved by using more than just the central scan line to form the result. The more image data uses in the calculation, the better the precision. Since overlay varies along both the X and Y axes, it is not yet known which (y) scan line is at the center of the target in that direction.

V. For each scan line (y), calculate a weighting factor w(y) that is a maximum where the best information is expected to be, which may be away from the central scan line. In the method described here, this weighting factor is the maximum value of f(s,y)=fmax(y).

VI. Use the weighting factor to calculate a refined estimate for fmin:

$$f(s) = \frac{\int_{-ROI}^{ROI} f_{max}(y) f(s, y) dy}{\int_{-ROI}^{ROI} f_{max}(y) dy} \qquad \text{Equation 2}$$

where f(s) is the weighted average of f(s,y), ROI is the region of interest, $f_{max}(Y)$ is used as the weighting function, and the minimum of f(s) is proportional to the overlay error.

These steps are performed because the center of the target (xc,yc) is not yet known. If it were known, an asymmetry could be calculated using:

$$f(s,y) = (I(xc+s,y) - I(xc-s,y)) \qquad \text{Equation 3}$$

where I(x,y) is the image intensity. The previous definition (from section III) of f(s,y) is signed, whereas more advantageously this new definition is unsigned. The use of an unsigned calculation for f(s,y) using the square of the differences in intensity avoids the need to find (xc,yc).

VII. Overlay is measured using fmin, which is proportional to signal intensity I. Consequently, measurement precision is improved if the result is normalized by the intensity so as to remove dependency on it. Overlay (e.g., misalignment of overlying targets on different layers) is calculated from fmin:

$$f'_{min} = \frac{f_{min}}{\sum_x \sum_y I(x, y)} \qquad \text{Equation 4}$$

the sum being performed for all points within the ROI.

VIII. If an unsigned symmetry function is used, then it never approaches zero if there is noise in the signal. This is shown in the upper or top trace in FIG. 4, which intersects the image symmetry axis between 0.00 and 0.01. In this case of an unsigned f(s,y), sensitivity is reduced or lost near zero overlay (where the upper and lower traces in FIG. 4 diverge). This result is easily overcome using a deliberate offset in the pattern. For example, is a 100 nm offset is programmed in, then all measurements can take place on the linear portion of symmetry vs. overlay offset curve shown in FIG. 4.

Figure 3:
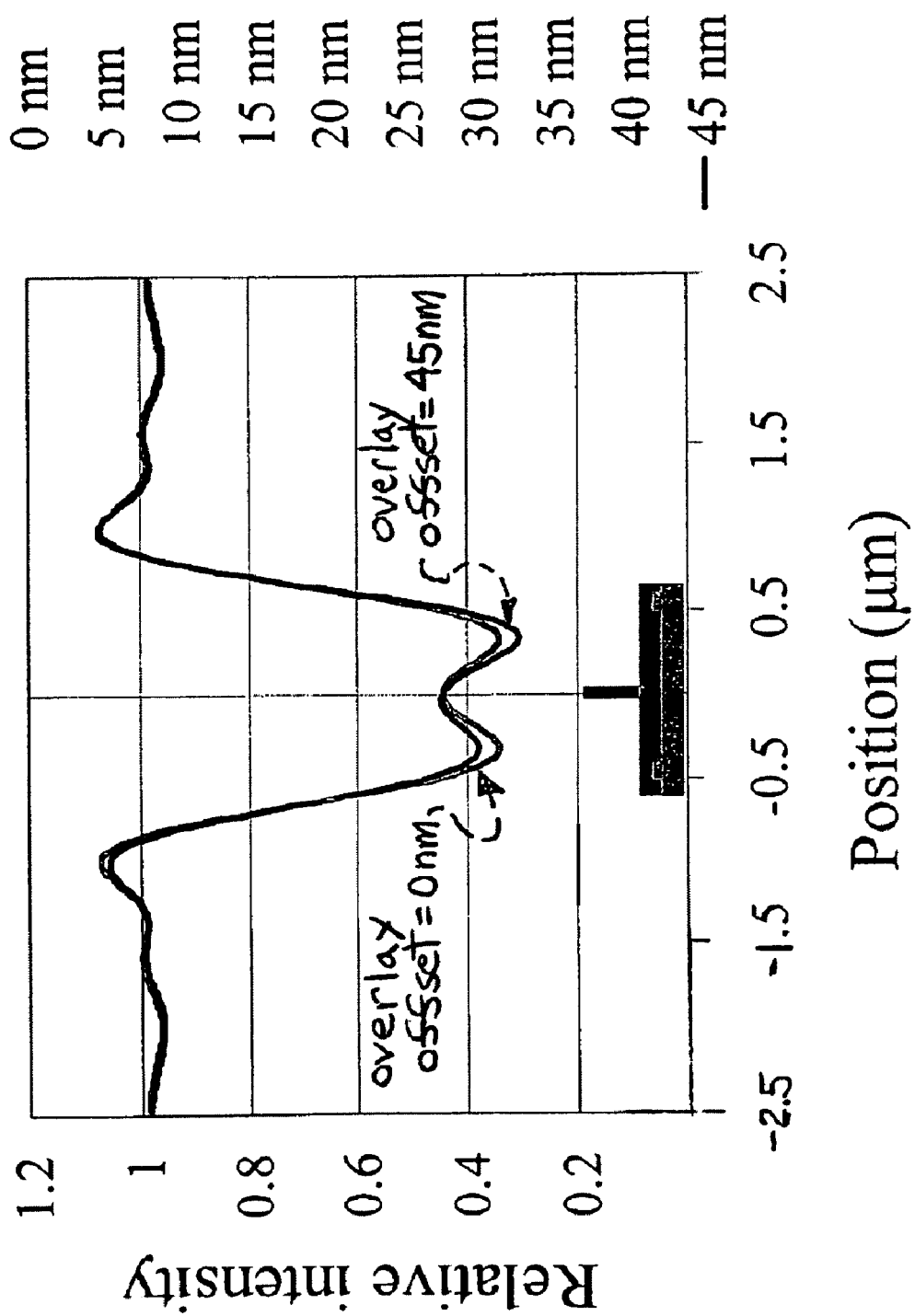
FIG. 3 is a graph of model simulations of relative light intensity measurements vs. position on either side of a target line (a one dimensional target) demonstrating asymmetry in the measurements.
Figure 5:
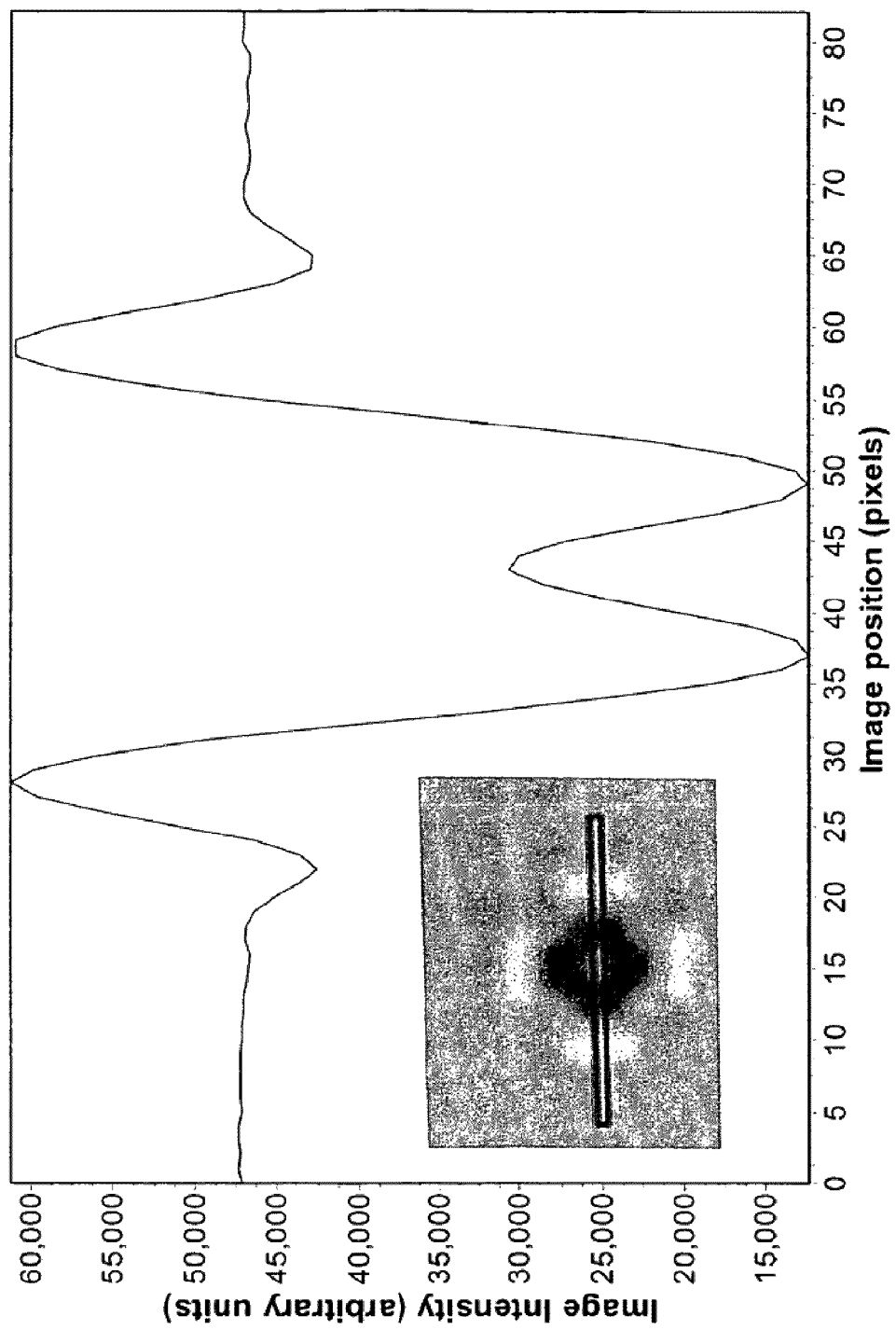
FIG. 5 is graph of the image profile (light intensity vs. position) of the slice through the target shown in the inset of FIG. 5. The inset in FIG. 5 shows a plan view with a slice through the center of the target shown in FIG. 1C, with minimal overlay error.
Figure 6:
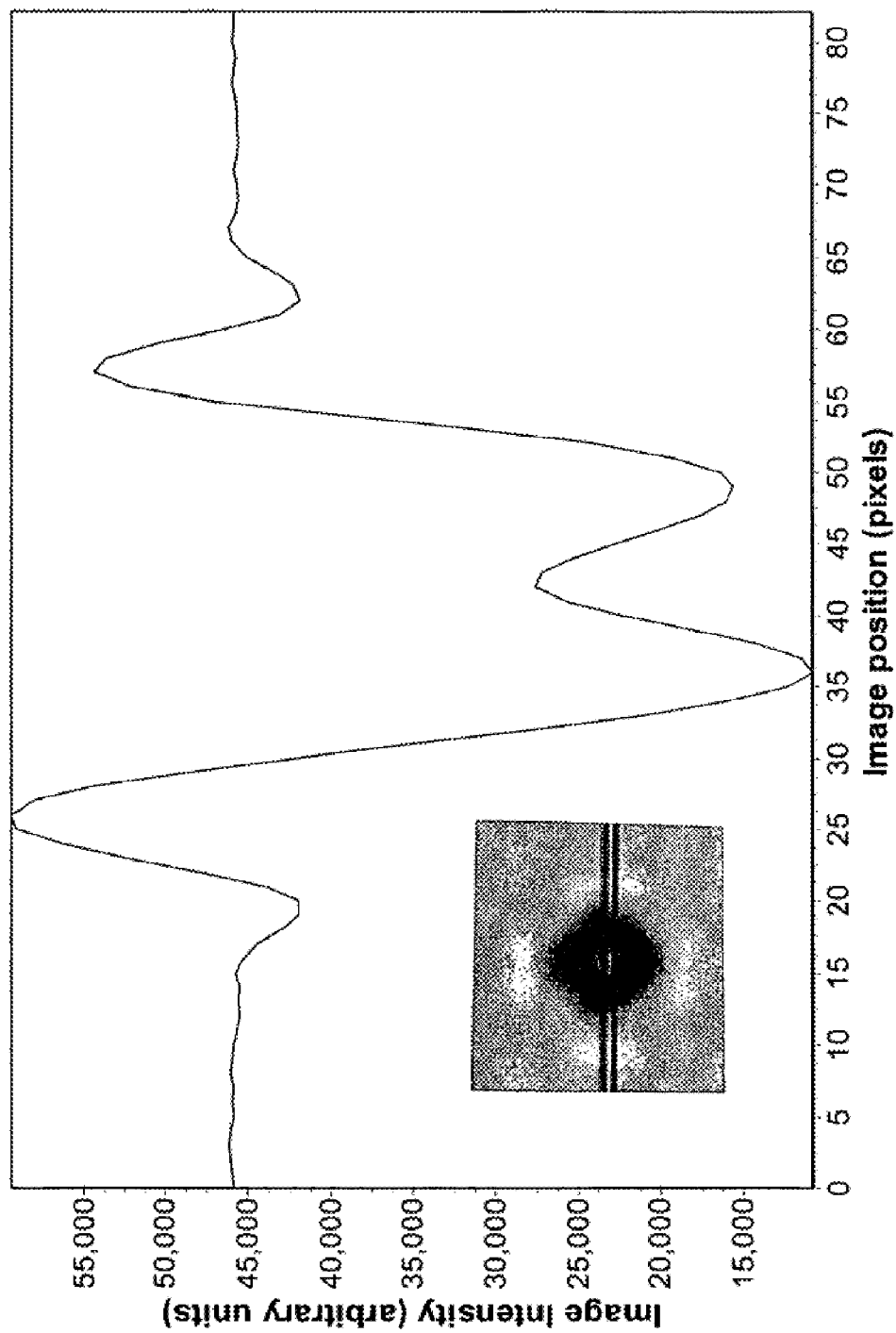
FIG. 6 is a graph of the image profile (light intensity vs. position) of the target shown in the inset in FIG. 6, showing the change in symmetry with a change in overlay offset. The inset in FIG. 6 is a photomicrograph of the target of FIG. 1C, this time with a large overlay error in the X-axis.

Referring to FIGS. 3 and 5, the image dimensions do not change with overlay. Similarly, image symmetry changes with overlay. Symmetry tracks overlay if there is no noise in the signal. Image noise limits the lowest offset that can be detected.

The model shown in FIG. 4 was calculated for a 1D target. The symmetry calculation for a 2D target, while more complicated, will be readily apparent from the description above. With a 2D target, there is less opportunity to use averaging to reduce effective noise.

A system for performing the measurements as described above may include a digital camera for capturing the target image. The digital camera is typically provided with optical magnification lenses (e.g., a microscope) and linked to a computer programmed to perform the steps described above. The system may also include a light source to illuminate the target, a stage to support the substrate, and robotics or actuators to move the stage, to move targets into alignment, typically under the lens. The digital camera, if used, acquires the target image, in the form of pixels. In the example shown, one pixel corresponds to about 104 nm. Interpolation may be used to resolve the position (s) to subdivide pixels. This allows for calculations of symmetry values about a point located between pixels.

In one embodiment, the in-chip region of interest (ROI) is defined to substantially completely enclose active features in an active area of a chip and the active features are used as the overlay target. Thus, instead of using a specifically designed target that must be placed within the active device area, such as the cross-in-frame design illustrated in FIG. 1, the overlay target may be the structures of the active region itself. Consequently, there is no need to make room within the chip or adjacent scribe lines for a specifically designed overlay target. Moreover, there is no need for the designer to include incorporate a non-functioning feature as the overlay target into the active regions of a device.

Figure 14:
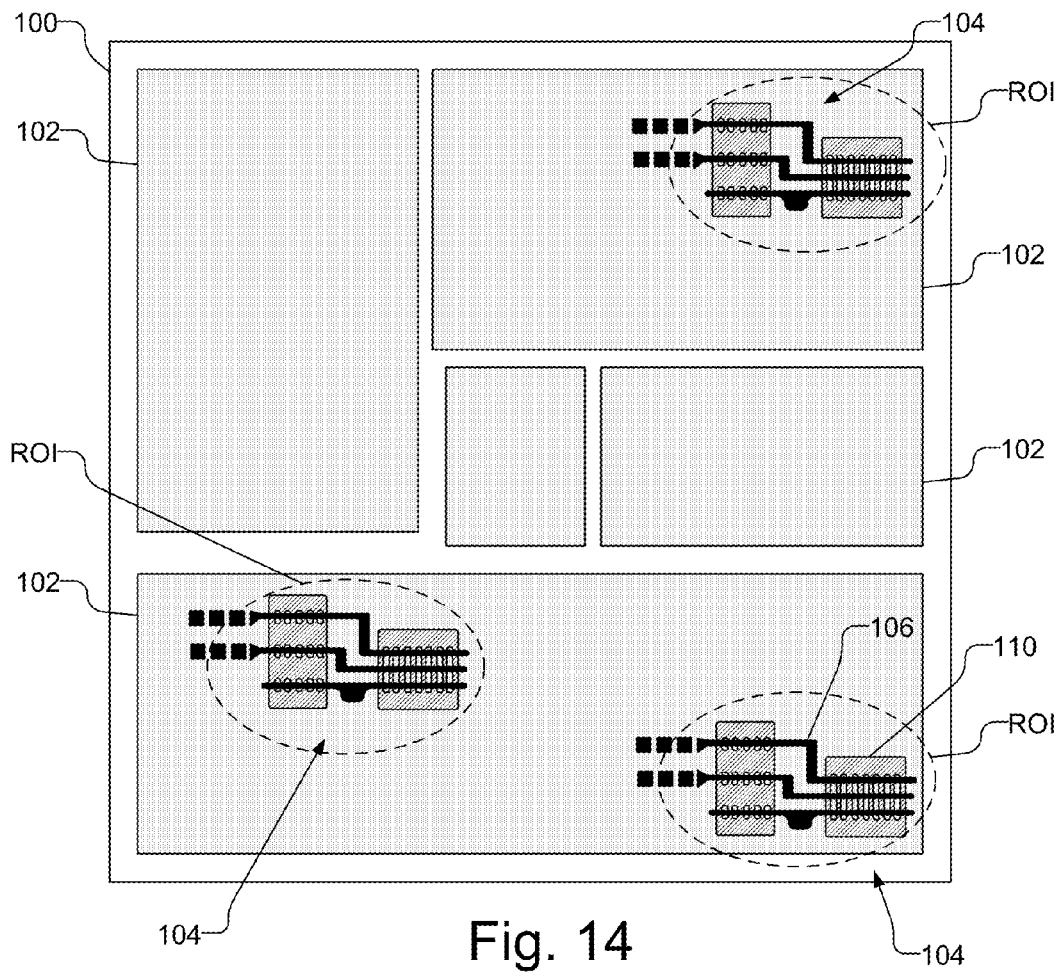
FIG. 14 illustrates the layout of single chip 100 that includes active features that are used as the overlay target mark.

By way of example, FIG. 14 illustrates the layout of single chip 100 (sometimes referred to as a die) that includes active features that are used as the overlay target mark. It should be understood that a substrate may include many chips 100. As illustrated in FIG. 14, the chip 100 includes one or more active regions 102. The active regions 102 may be interconnected or may be interconnected after additional processing. FIG. 14 illustrates active features 104 within the active regions 102. The active features 104 are features that cause the chip to function as desired. It should be understood that the active features 104 may be permanent structures on the device or may be non-permanent structures that are used during processing to produce the permanent functional structures, by way of example, at least part of the active features may be formed from photoresist. FIG. 14 illustrates the active features 104 in an exaggerated large scale for clarity. Moreover, while not shown for the sake of simplicity and clarity, the active regions 102 may contain many structures similar to active features 104 as well as additional structures necessary for the functioning of the device. The broken lines ROI illustrate the region of interest on the chip 100 that are used to enclose the active features 104, which form the overlay target, and thus, the active features 104 are sometimes referred to as overlay target 104.

The active feature 104 illustrated in FIG. 14 includes a top layer 106 shown with solid lines and a bottom layer 108 shown with hatching. The alignment of the top layer 106 with respect to the bottom layer 108 provides the overlay information. The overlay target may be the structures of any active feature that includes overlying layers, where the displacement of one layer relative to another may be used to determine alignment. By way of example, the active features 104 may be poly 'word lines' the run between to active source/drain regions of a transistor delineated by isolation trenches. The source/drain regions become the outer region of the overlay target and the poly word lines becomes the inner structure. The overlay error, e.g., the displacement in the x or y direction, of the word line structures creates an asymmetry in an image that can then be analyzed for the overlay error.

The active features 104 that form the overlay target need not be symmetric as long as the nominal position of the structure is known. For example, if the active features 104 are asymmetric when there is no overlay error, any overlay error will alter the known asymmetry, which can then be measured to determine the overlay error. As noted previously, use of structures that are asymmetric when overlay error is zero is advantageous if image noise limits the smallest asymmetry that can be measured, since the asymmetry to overlay response is then shifted to a linear portion of the response function. Measurement using symmetric targets is still possible as a qualitative check for adequate alignment at a minimum, and with useful quantitative data regarding larger overlay errors.

Figure 15:
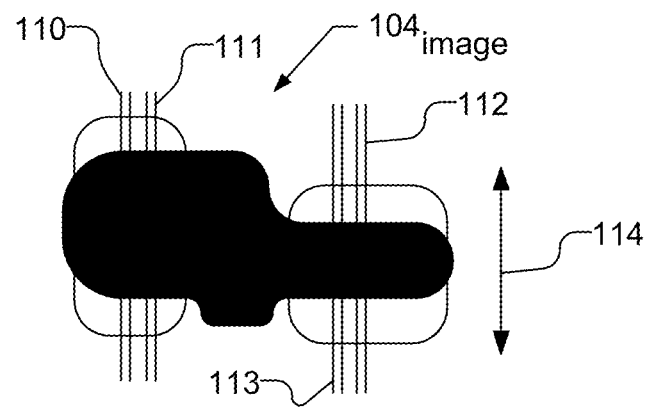
FIG. 15 illustrates a sub-resolution image of an active feature overlay target produced by, e.g., a two-dimensional camera such as a CCD camera.

FIG. 15 illustrates a sub-resolution image $104_{image}$ of an overlay target 104 produced by, e.g., a two-dimensional camera such as a CCD camera. A scan line 110 is illustrated over the image $104_{image}$ running along the direction of measurement, illustrated by arrow 114. As described above, an initial candidate center point is selected and the light intensity of the image $104_{image}$ across the scan line 110 is measured. The measured light intensity on one side of the center point is compared to the measured light intensity at a corresponding point on the other side of the center point. A calculation may then be performed indicating the degree of symmetry in the image along the scan line. The determined symmetry value from the scan line 110 may be used to calculate the target overlay error. The determined overlay error may then be stored, e.g., in memory in the computer performing the process described and/or displayed to the user.

If desired, the image $104_{image}$ may be scanned along additional scan lines 111, 112, and 113 and the degree of symmetry is determined for each scan line, which may improve precision. Additional or fewer scan lines may be used if desired. It should be understood that the candidate center point may be at different locations for different scan lines, such as scan line 110 and scan line 112. As described above, if desired, the candidate center point for a scan line may be modified based on the calculated symmetry from a previously analyzed scan line. After a symmetry value for substantially each scan line is determined, the symmetry values may be combined to derive a combined single symmetry value, which is used to calculate target overlay error, which is then stored, e.g., in memory in the computer performing the process described and/or displayed to the user.

Because the overlay target 104 is not specifically designed to measure overlay error, it is necessary to locate an appropriate active features that may be used as the overlay target 104. The active features that may be used as the overlay target 104 should meet certain geometrical rules for feature size and layout. For example, the active features selected to be used as the overlay target 104 may include little or no underlying patterns that may complicate the analysis. Moreover, the feature size and layout of an appropriate active feature may be selected based in part on the resolution of the metrology equipment and in particular the camera. For example, with small geometries with critical dimensions below the resolution limit of the camera, the ROI may be chosen to include multiple active features, which together are above the resolution limit of the camera. Conversely, when a relatively large geometry structure is to be measured, a low resolution system, e.g., camera may be used so that the desired sub-resolution image of the overlay target maybe produced. Moreover, it may be desirable for the overlay target 104 to include an asymmetry to serve as a built in initial overlay error so that the measurement will be located on the linear section of the graph shown in FIG. 4.

Patterns found in the active circuit design are more likely to be irregular, as illustrated in FIGS. 14 and 15, than targets specifically designed for the measurement, as the latter are normally designed to be centrally and rotationally symmetric, other than deliberate offsets introduced to ensure the target operates on a linear region of the asymmetry-to-overlay response curve. FIG. 15 is an example where the width of the target $104_{image}$ differs at different scan lines, e.g., scan lines 110 and 112. The asymmetry-to-overlay relationship will generally be different in such different regions. Measurement is still possible by using only scan lines from an area with the same designed dimensions, e.g., scan lines 110 and 111, or by using multiple regions but combining the results appropriately. For example, the asymmetry may be converted to overlay independently for each region, and the resulting overlay for each region may be combined, e.g., by averaging. Alternatively, the symmetry values or the scan lines may be averaged using the methods described above and applying an appropriate asymmetry-to-overlay conversion.

One method of locating appropriate active features to be used as the overlay target 104 includes loading a substrate including the one or more chips, positioning the ROI over different active features, and imaging the active features until an appropriate set of active features is located. Once an appropriate set of active features is located, the position is stored. The position may then be used to locate the active features in future wafers, as well as in other chips on the substrate.

Alternatively, a search of the electronic design database (EDA) of the chip 100 may be performed to determine appropriate active features within the chip that may be used as the overlay target 104 and the location of these active features on the chip 100, which is then stored. During measurement, the chip 100 is positioned to place the stored location of the active features 104 in the field of view of the imaging optics. The database can be searched for structures within select layers that fit the rules of the overlay target, such as sensitivity to overlay errors. In the case of discrete structures, specific geometry and size rules can be used in the search of the design layout database. Additionally, the technique can be applied to macro or cell based structures made up of mesoscopic features. For example, a series of 50 nm gates may define a 1 µm mesoscopic structure of line space gratings. The locally defined mesoscopic structures, thus, can define an overlay target.

Figure 16:
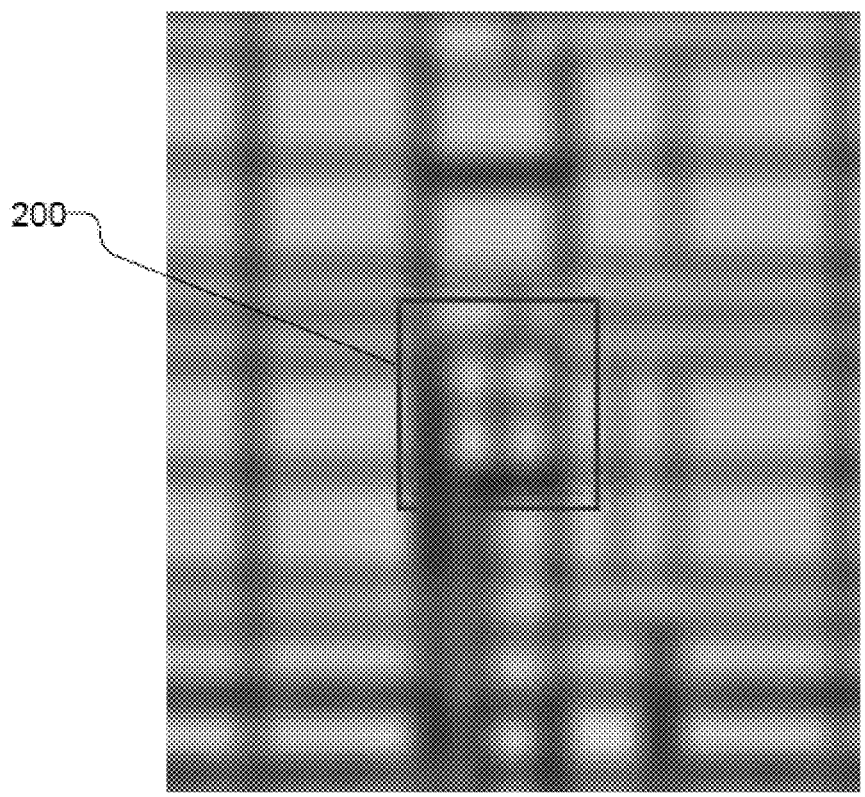
FIG. 16 is an image of active features in an active area of a production wafer that includes an illustrated Region of Interest (ROI) for metrology.

By way of example, FIG. 16 is an image of active features in an active area of a production wafer where a Region of Interest (ROI) 200 for metrology is indicated. As can be seen, within the ROI is a target that has a cross-in-frame configuration. The cross-in-frame target is asymmetric as there are thicker lines on the left and bottom.

Reference to overlay here means overlay error or overlay offset, e.g., the difference in position or misalignment of a target on one layer with another underlying target on another layer. Reference here to a step performed on each or substantially each scan line, or other parameter, means that one or more scan lines or other parameters may be skipped, within the scope of the invention. Reference here to a minimum value also includes a maximum value, and vice versa, since various equivalent calculations may be used interchanging maximums and minimums. The terms maximum and minimum here also include near maximum and minimum values, as benefits of the invention may be obtained even when practiced in a less effective form. The systems and methods described are useful in manufacturing a wide array of microscale devices formed in layers. These include microelectronic semiconductor devices, and also micro-mechanical, micro-electromechanical, and micro-optical devices, thin film devices, memory devices, etc. Various changes, substitutions and modifications can of course be made without departing from the spirit and scope of the invention. The invention, therefore should not be limited only to the specific examples and descriptions provided above. Rather, the invention includes the full range of equivalents of the elements and steps described and shown.

What is claimed is:

1. A method for measuring overlay error, comprising:
acquiring an image of an overlay target in an active area of a substrate, the overlay target having a first target component on a first layer and an overlying second target component on a second layer,
measuring light intensity along a first scan line of the image;
calculating a first symmetry value of the first scan line using the measured light intensity along the first scan line; and
calculating an offset between the first target component and the second target component using the first symmetry value.

2. The method of claim 1, further comprising:
measuring light intensity along a plurality of scan lines of the image; and
using the measured light intensity along the plurality of scan lines of the image to calculate the offset between the first target component and the second target component.

3. The method of claim 1, further comprising:
measuring light intensity along a second scan line of the image; and
calculating a second symmetry value of the second scan line of the image using the measured light intensity along the second scan line;
wherein calculating the offset between the first target component and the second target component uses the first symmetry value and the second symmetry value.

4. The method of claim 3, further comprising combining the first symmetry value and the second symmetry value into a single refined symmetry value, and wherein calculating the offset comprises using the refined symmetry value.

5. The method of claim 4, wherein combining the first symmetry value and the second symmetry value into a single refined symmetry value comprises determining an average symmetry value using the first symmetry value and the second symmetry value.

6. The method of claim 3, further comprising:
calculating a first preliminary offset using the first symmetry value;
calculating a second preliminary offset using the first symmetry value;
averaging the first preliminary offset and the second preliminary offset to calculate the offset between the first target component and the second target component.

7. The method of claim 1, further comprising:
measuring light intensity along a second scan line of the image; and
calculating a second symmetry value of the second scan line of the image using the measured light intensity along the second scan line;
comparing the first symmetry value and the second symmetry value to determine the lowest minimum symmetry value.

8. The method of claim 1, further comprising:
measuring light intensity along a second scan line of the image; and
combining the first scan line and the second scan line to produce a single scan line;
wherein calculating the first symmetry value comprises calculating the first symmetry value using the single scan line.

9. The method of claim 8, wherein combining the first scan line and the second scan line to produce a single scan line comprises averaging the intensities of the first scan line and the second scan line.

10. The method of claim 8, further comprising measuring light intensity along more than two scan lines of the image and combining the more than two scan lines to produce a single scan line.

11. The method of claim 1, wherein the overlay target is formed of active features in an active area of a chip.

12. The method of claim 11, wherein the active features are structures that cause the chip to function as desired when completed.

13. The method of claim 11, wherein the active features are permanent structures on the chip.

14. The method of claim 11, wherein the active features are non-permanent structures that are used to define permanent functional structures on the chip.

15. The method of claim 11, wherein the active features define an asymmetrical overlay target.

16. The method of claim 11, wherein acquiring an image of an overlay target in an active area of a substrate comprises:
searching an electronic database of the chip to determine the active features to be used as the overlay target and a location of the active features on the chip;
positioning the substrate to place the active features on the chip in the field of view of imaging optics; and
acquiring the image of the active features.

17. The method of claim 16, wherein searching the electronic database comprises searching for active features with an asymmetry, wherein the second target component is designed to be offset with respect to the first target component.

18. The method of claim 16, wherein searching the electronic database of the chip to determine the active features to be used as the overlay target comprises searching for active structures that meet desired criteria including at least one of sensitivity to overlay errors, geometry rules and size rules.

19. The method of claim 11, wherein acquiring an image of an overlay target in an active area of a substrate comprises:
imaging a plurality of different active features on a chip; and
analyzing the images of the plurality of different active features to determine the active features to be used as the overlay target.

20. The method of claim 11, wherein the active features may include mesoscopic features.

21. A method for measuring overlay error, comprising:
analyzing a plurality of active features on a chip to determine the active features to be used as an overlay target; the active features being in an active area of a chip and include a first component on a first layer and an overlying second component on a second layer;
acquiring an image of the active features to be used as the overlay target;
measuring light intensity along a first scan line of the image;
calculating a first symmetry value of the first scan line based on the measured light intensity along the first scan line;
calculating an offset between the first target component and the second target component using the first symmetry value.

22. The method of claim 21, further comprising:
measuring light intensity along a plurality of scan lines of the image; and
using the measured light intensity along the plurality of scan lines of the image to calculate the offset between the first target component and the second target component.

23. The method of claim 21, further comprising:
measuring light intensity along a second scan line of the image; and
calculating a second symmetry value of the second scan line of the image using the measured light intensity along the second scan line;
wherein calculating the offset between the first target component and the second target component uses the first symmetry value and the second symmetry value.

24. The method of claim 23, further comprising combining the first symmetry value and the second symmetry value into a single refined symmetry value, and wherein calculating the offset comprises using the refined symmetry value.

25. The method of claim 24, wherein combining the first symmetry value and the second symmetry value into a single refined symmetry value comprises determining an average symmetry value using the first symmetry value and the second symmetry value.

26. The method of claim 23, further comprising:
calculating a first preliminary offset using the first symmetry value;
calculating a second preliminary offset using the first symmetry value;
averaging the first preliminary offset and the second preliminary offset to calculate the offset between the first target component and the second target component.

27. The method of claim 21, further comprising:
measuring light intensity along a second scan line of the image; and
calculating a second symmetry value of the second scan line of the image using the measured light intensity along the second scan line;
comparing the first symmetry value and the second symmetry value to determine the lowest minimum symmetry value.

28. The method of claim 21, further comprising:
measuring light intensity along a second scan line of the image; and combining the first scan line and the second scan line to produce a single scan line;

wherein calculating the first symmetry value comprises calculating the first symmetry value using the single scan line.

29. The method of claim 28, wherein combining the first scan line and the second scan line to produce a single scan line comprises averaging the intensities of the first scan line and the second scan line.

30. The method of claim 28, further comprising measuring light intensity along more than two scan lines of the image and combining the more than two scan lines to produce a single scan line.

31. The method of claim 21, wherein the active features are structures that cause the chip to function as desired when completed.

32. The method of claim 21, wherein the active features are permanent structures on the chip.

33. The method of claim 21, wherein the active features are non-permanent structures that are used to define permanent functional structures on the chip.

34. The method of claim 21, wherein the active features define an asymmetrical overlay target.

35. The method of claim 21, wherein analyzing a plurality of active features on a chip to determine the active features to be used as an overlay target comprises searching an electronic database of the chip to determine the active features to be used as the overlay target.

36. The method of claim 35, wherein searching the electronic database comprises searching for active features with an asymmetry, wherein the second target component is designed to be offset with respect to the first target component.

37. The method of claim 35, wherein searching the electronic database of the chip to determine the active features to be used as the overlay target comprises searching for active structures that meet desired criteria including at least one of sensitivity to overlay errors, geometry rules and size rules.

38. The method of claim 21, wherein analyzing a plurality of active features on a chip to determine the active features to be used as an overlay target comprises:

imaging a plurality of different active features on a chip; and analyzing the images of the plurality of different active features to determine the active features to be used as the overlay target.

39. The method of claim 21, wherein the active features may include mesoscopic features.

* * * * *